United States Patent
You et al.

(10) Patent No.: US 11,870,444 B1
(45) Date of Patent: Jan. 9, 2024

(54) ENTROPY SOURCE CIRCUIT

(71) Applicant: PUFsecurity Corporation, Hsinchu County (TW)

(72) Inventors: Chun-Heng You, Hsinchu County (TW); Kai-Hsin Chuang, Hsinchu County (TW); Chi-Yi Shao, Hsinchu County (TW)

(73) Assignee: PUFsecurity Corporation, Hsinchu County (TW)

( * ) Notice: Subject to any disclaimer, the term of this patent is extended or adjusted under 35 U.S.C. 154(b) by 0 days.

(21) Appl. No.: 18/097,502

(22) Filed: Jan. 17, 2023

(30) Foreign Application Priority Data

Aug. 4, 2022  (TW) .................................. 111129255

(51) Int. Cl.
   *H03K 3/84* (2006.01)
   *G04F 10/00* (2006.01)
   (Continued)

(52) U.S. Cl.
   CPC ............. *H03K 3/84* (2013.01); *G04F 10/005* (2013.01); *H03K 3/037* (2013.01); *H03K 19/21* (2013.01)

(58) Field of Classification Search
   CPC .......... H03K 3/037; H03K 3/84; H03K 5/131; H03K 5/14; H03K 19/20; H03K 19/21; G04F 10/005; G06F 1/022
   See application file for complete search history.

(56) References Cited

U.S. PATENT DOCUMENTS

| 6,862,605 | B2 * | 3/2005 | Wilber | G06F 7/588 |
| | | | | 708/251 |
| 8,321,773 | B1 * | 11/2012 | Pedersen | G06F 21/86 |
| | | | | 714/790 |

(Continued)

FOREIGN PATENT DOCUMENTS

PL           225187 B1    2/2017

OTHER PUBLICATIONS

Ronaldo Serrano, Ckristian Duran, Trong-Thuc Hoang, Marco Sarmiento, Khai-Duy Nguyen, Akira Tsukamoto, Kuniyasu Suzaki, and Cong-Kha Pham, A Fully Digital True Random Number Generator With Entropy Source Based in Frequency Collapse, Jul. 26, 2021, IEEE, USA.

(Continued)

*Primary Examiner* — Long Nguyen
(74) *Attorney, Agent, or Firm* — Winston Hsu (57) ABSTRACT

An entropy source circuit is provided. The entropy source circuit includes a digital circuit, a determination circuit and a time-to-digital converter (TDC), wherein the determination circuit is coupled to the digital circuit, and the TDC is coupled to the determination circuit. The digital circuit is configured to generate result data at a second time point according to input data received at a first time point, and the determination circuit is configured to perform determination on reference data with dynamic output generated by the digital circuit, to generate a determination result, wherein the reference data is equal to the result data. In addition, the TDC is configured to perform a time-to-digital conversion on a delay of the digital circuit for generating the result data according to the input data with aid of the determination signal, in order to generate entropy data corresponding to the delay.

20 Claims, 8 Drawing Sheets

(51) Int. Cl.
  *H03K 19/21*    (2006.01)
  *H03K 3/037*    (2006.01)

(56) References Cited

U.S. PATENT DOCUMENTS

| | | |
|---|---|---|
| 9,727,310 B2 | 8/2017 | Margetts |
| 2011/0128081 A1 | 6/2011 | Hars |
| 2015/0178048 A1 | 6/2015 | Burleson |

OTHER PUBLICATIONS

Kaiyuan Yang, David Blaauw, Dennis Sylvester, A Robust -40 to 120° C. All-Digital True Random Number Generator in 40nm CMOS, 2015, IEEE, USA.

Carlos Tokunaga et al., True Random Number Generator with a Metastability-Based Quality Control, 2007 IEEE International Solid-State Circuits Conference—Digest of Technical Papers, Feb. 14, 2007, pp. 404-405 & 611, Session 22 / Digital Circuit Innovations / 22.4, IEEE, XP031111266, Feb. 14, 2007.

\* cited by examiner

ENTROPY SOURCE CIRCUIT

BACKGROUND OF THE INVENTION

1. Field of the Invention

The present invention is related to generating entropy mechanisms, and more particularly, to an entropy source circuit for collecting randomness from operation time of a digital circuit.

2. Description of the Prior Art

In current electronic systems, random number generators are typically needed for generating random numbers, which are configured to be used in security related functions. Related art random number generators generate high quality true random numbers based on circuits which inherently have randomness such as oscillators and thermal noise samplers. These circuits are analog circuits, however, making design of these circuits difficult to be integrated into an all-digital design flow.

In order to effectively reduce overall costs (e.g. human tasks, design schedules), there is a need for a novel method and associated architecture that can enable the operation of collecting randomness to be implemented with an all-digital circuit.

SUMMARY OF THE INVENTION

An objective of the present invention is to provide an entropy source circuit and a method for collecting randomness from operation time of a digital circuit, to make a design flow of the entropy source circuit capable of being integrated into an all-digital design flow, thereby improving overall manufacturing efficiency.

At least one embodiment of the present invention provides an entropy source circuit. The entropy source circuit comprises a digital circuit, a determination circuit and a time-to-digital converter (TDC), wherein the determination circuit is coupled to the digital circuit, and the TDC is coupled to the determination circuit. The digital circuit may be configured to generate a result data at a second time point according to an input data received at a first time point, and the determination circuit may be configured to perform determination on reference data with a dynamic output generated by the digital circuit, in order to generate a determination signal, wherein the reference data is equal to the result data. In addition, the TDC may be configured to perform time-to-digital conversion on a delay of the digital circuit for generating the result data according to the input data with aid of the determination signal, in order to generate entropy data corresponding to the delay, wherein a time difference between the first time point and the second time point represents the delay.

At least one embodiment of the present invention provides an entropy source circuit. The entropy source circuit comprises an input data control circuit, a digital circuit, a determination circuit and a TDC. The input data control circuit may be configured to output a start signal, input data, and reference data corresponding to the input data. The digital circuit has an input terminal and an output terminal, and the input terminal of the digital circuit may be configured to receive the input data. The determination circuit is coupled to the output terminal of the digital circuit, and may be configured to receive the reference data, wherein when an output generated on the output terminal of the digital circuit is equal to the reference data, the determination circuit generates a determination signal. In addition, the TDC is coupled to the input data control circuit and the determination circuit, and may be configured to receive the start signal and generate entropy data according to the start signal and the determination signal.

The entropy source circuit provided by the embodiments of the present invention can convert a delay of operations of a digital circuit into a digital signal. As the delay has randomness, the digital signal can also have randomness. In comparison with the related art, the present invention does not need additional analog circuits such as an oscillator or a thermal noise sampler. Thus, the design of an overall circuit of the present invention can be integrated into a digital design flow, and an overall manufacturing efficiency can be effectively improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
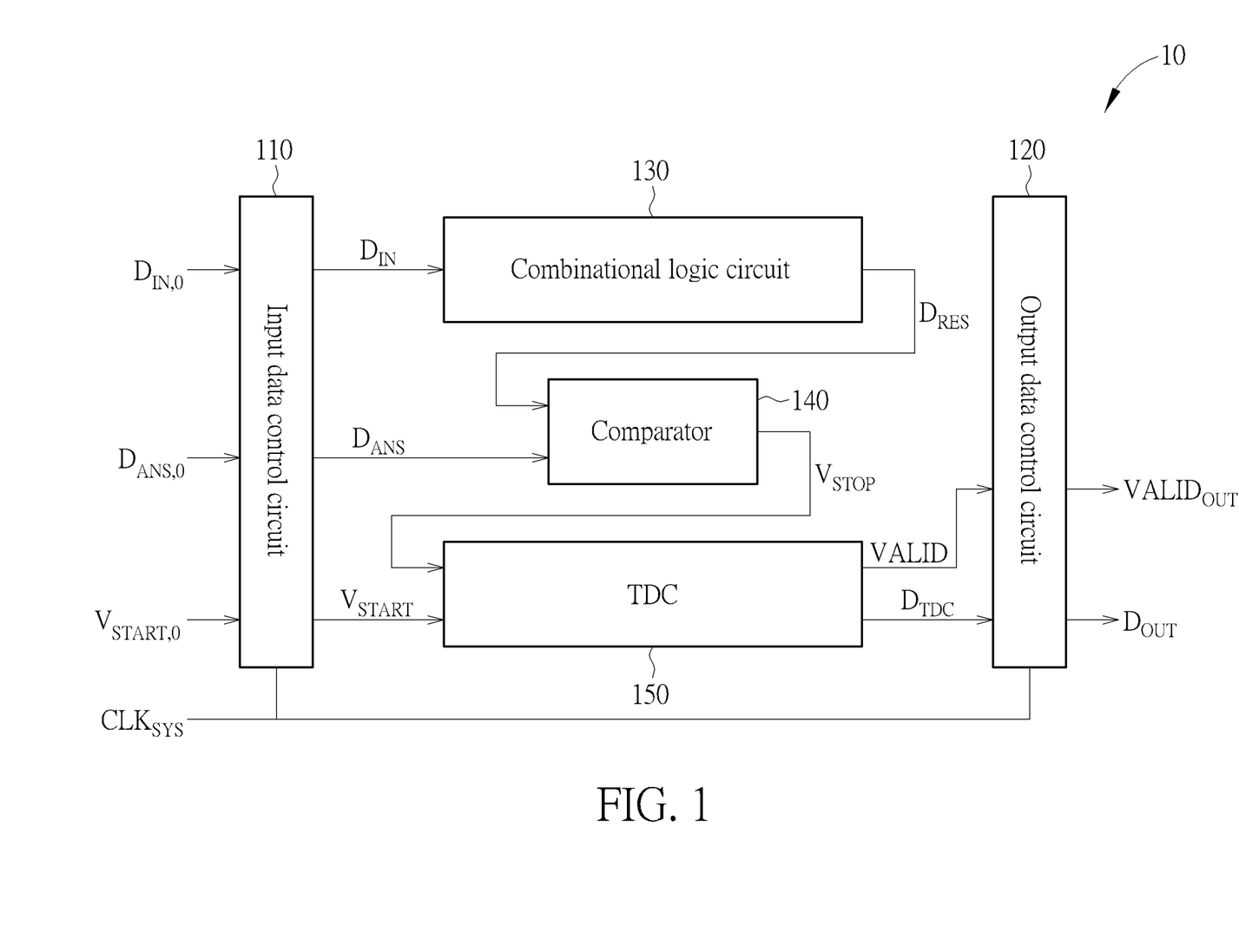
FIG. 1 is a diagram illustrating an entropy source circuit according to an embodiment of the present invention.

FIG. 1 is a diagram illustrating an entropy source circuit 10 according to an embodiment of the present invention. As shown in FIG. 1, the entropy source circuit 10 may comprise an input data control circuit 110, an output data control circuit 120, a digital circuit such as a combinational logic circuit 130, a determination circuit such as a comparator 140, and a time-to-digital converter (TDC) 150. In this embodiment, the input data control circuit 110 may receive input data $D_{IN,0}$, reference data $D_{ANS,0}$, external control signals such as a start signal $V_{START,0}$ and a system clock $CLK_{SYS}$, and may perform timing control on the input data $D_{IN,0}$, the reference data $D_{ANS,0}$ and the start signal $V_{START,0}$, to output input data $D_{IN}$ and the start signal $V_{START}$ based on timing of the system clock $CLK_{SYS}$. In detail, at a time point of the input data $D_{IN}$ being transmitted to the combinational logic circuit (e.g. a time point of the system clock being pulled up), the start signal $V_{START}$ is concurrently transmitted to the TDC 150, to make the TDC 150 determine a time point of start timing according to the start signal $V_{START}$.

In addition, the combinational logic circuit 130 may be configured to generate a result data $D_{RES}$ according to the input data $D_{IN}$. For example, the combinational logic circuit 130 may perform a logic operation on one or more sets of sub-data within the input data $D_{IN}$ to generate the result data $D_{RES}$. The reference data $D_{ANS}$ may be arranged in advance before the input data $D_{IN}$ is transmitted to the combinational logic circuit 130, to make the reference data $D_{ANS}$ be equal to the result data $D_{RES}$, and the comparator 140 may be configured to perform determination on the reference data $D_{ANS}$ with data output from the combinational logic circuit 130, in order to generate a determination signal such as $V_{STOP}$. When the combinational logic circuit 130 has not yet completed the aforementioned logic operation mentioned (e.g. a dynamic output of the combinational logic circuit 130 is not result data $D_{RES}$), the determination signal $V_{STOP}$ may have a first logic value (e.g. a logic value "0"). When the combinational logic circuit 130 completes the aforementioned logic operation mentioned (e.g. the dynamic output of the combinational logic circuit 130 is equal to the result data $D_{RES}$), the determination signal $V_{STOP}$ may have a second logic value (e.g. a logic value "1"). In other embodiments, the determination circuit may be implemented by other circuit components which have the function of determining "whether the reference data $D_{ANS}$ and the result data $D_{RES}$ are identical".

A time point of a logic value of the determination signal $V_{STOP}$ being changed may be arranged for representing a time point of the combinational logic circuit 130 completing the aforementioned logic operation. In some embodiments, the reference data $D_{ANS}$ may be transmitted to the comparator 140 at the same time point of transmitting the input data $D_{IN}$ to the combinational logic circuit 130, but the present invention is not limited thereto. In other embodiments, the reference data $D_{ANS}$ may be transmitted to the comparator 140 in advance before the time point of transmitting the input data $D_{IN}$ to the combinational logic circuit 130, or the reference data $D_{ANS}$ may be transmitted to the comparator 140 after the time point of transmitting the input data $D_{IN}$ to the combinational logic circuit 130, but the present invention is not limited thereto. It should be noted that, as long as the reference data $D_{ANS}$ can be transmitted to the comparator 140 before the combinational logic circuit 130 completes the aforementioned logic operation (e.g. before a time point of outputting the correct result data $D_{RES}$), the timing of the input data control circuit 110 transmitting the reference data $D_{ANS}$ to the comparator 140 may vary.

The TDC 150 may be configured to perform time-to-digital conversion on a delay of the combinational logic circuit 130 generating the result data $D_{RES}$ according to the input data $D_{IN}$ with aid of the determination signal $V_{STOP}$, in order to generate entropy data $D_{TDC}$ corresponding to the delay. For example, the combinational logic circuit 130 may receive the input data $D_{IN}$ at a first time point, and the determination signal $V_{STOP}$ may indicate that the data output from the combinational logic circuit 130 is equal to the result data $D_{RES}$ at a second time point, where a time difference between the first time point and the second time point may represent the delay. In detail, the dynamic output of the combinational logic circuit 130 during a period between the first time point and the second time point may be invalid values, outputs generated based on previous input data (e.g. last data of $D_{IN}$), or a temporary erroneous result caused by delays (e.g. propagation delay or operation delay). Thus, the dynamic output of the combinational logic circuit 130 during a period between the first time point and the second time point may be different from the result data $D_{ANS}$, making the determination signal $V_{STOP}$ output from the comparator 140 be the first logic value which indicates that the combinational logic circuit 130 has not yet output the correct result data $D_{RES}$. When the comparator 140 detects that the dynamic output of the combinational logic circuit 130 is equal to the reference data $D_{ANS}$ at the second time point (which means the combinational logic circuit 130 has output the correct result data $D_{RES}$), the determination signal $V_{STOP}$ may be pulled to the second logic value, and the TDC 150 may determine a time point of stop timing according to the determination signal $V_{STOP}$. In addition, the TDC 150 may utilize a flag signal VALID to indicate that the entropy data $D_{TDC}$ is valid when the time-to-digital conversion is completed, but the present invention is not limited thereto. The output data control circuit 120 may perform timing control on the entropy data $D_{TDC}$ and the flag signal VALID according to the system clock $CLK_{SYS}$, to output entropy data DOUT and a flag signal $VALID_{OUT}$ that are synchronous with the system clock $CLK_{SYS}$. For example, the output data control circuit 120 may generate and output the entropy data DOUT and the flag signal $VALID_{OUT}$ according to the entropy data $D_{TDC}$ and the flag signal VALID at transition edges of the system clock $CLK_{SYS}$, but the present invention is not limited thereto.

Figure 2:
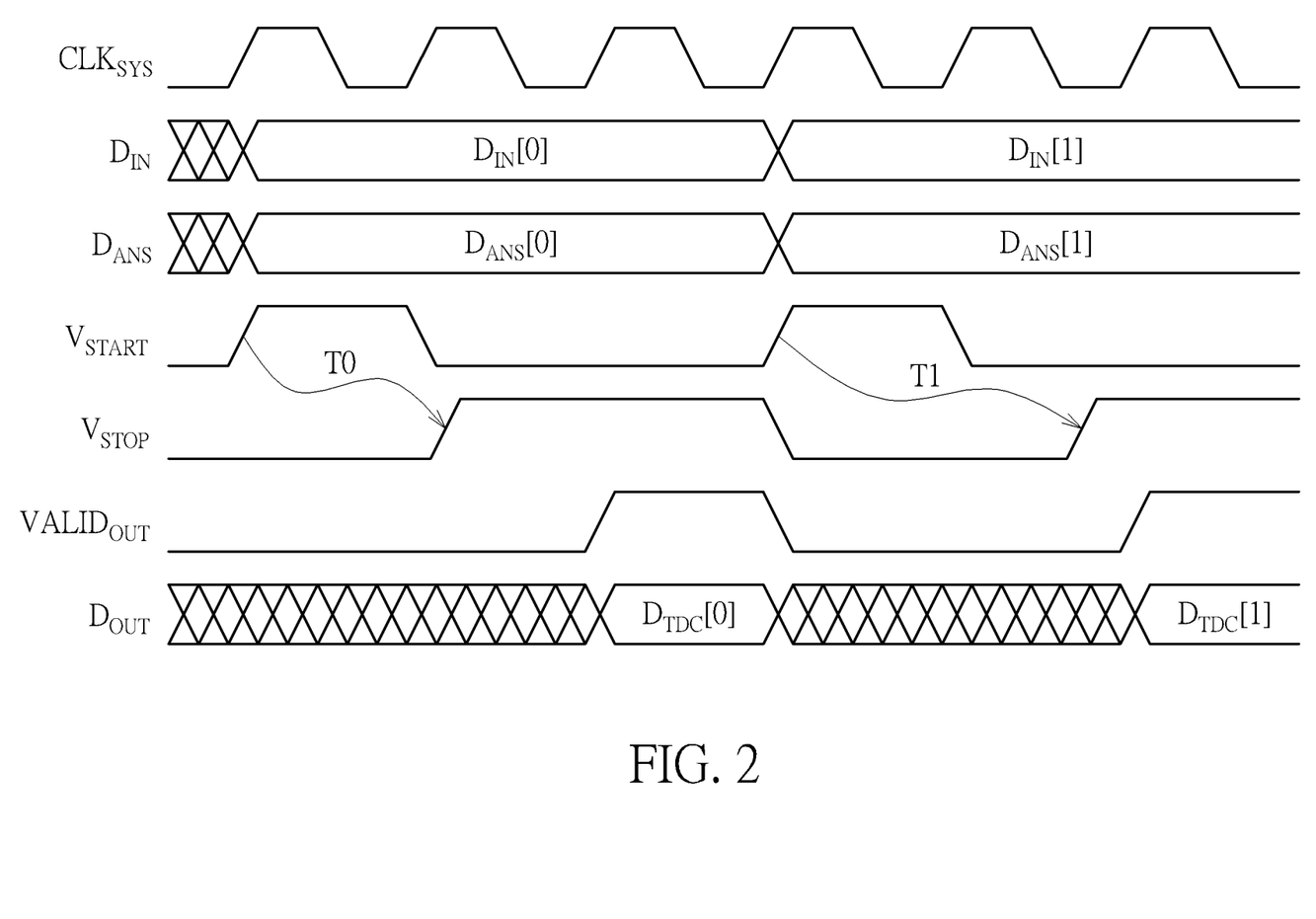
FIG. 2 is a diagram illustrating data and signals of FIG. 1 according to an embodiment of the present invention.

FIG. 2 is a diagram illustrating data and signals of FIG. 1 such as the system clock $CLK_{SYS}$, the input data $D_{IN}$, the reference data $D_{ANS}$, the start signal $V_{START}$, the determination signal $V_{STOP}$, the flag signal $VALID_{OUT}$ and the entropy data $D_{TDC}$ according to an embodiment of the present invention. As shown in FIG. 2, at a time point of the start signal $V_{START}$ changing from the first logic value (e.g. the logic value "0") into the second logic value (e.g. the logic value "1"), such as a time point of a first rising edge of the start signal $V_{START}$ shown in FIG. 2 (which may be an example of the first time point mentioned above), the input data $D_{IN}$ may be $D_{IN}[0]$, and the reference data $D_{ANS}$ may be $D_{ANS}[0]$, which means the combinational logic circuit 130 receives the input data $D_{IN}[0]$ and starts performing the logic operation on the input data $D_{IN}[0]$. After a delay T0, the combinational logic circuit 130 may complete the logic operation performed on the input data $D_{IN}[0]$ to make the result data $D_{RES}$ be equal to the reference data $D_{ANS}[0]$, and the determination signal $V_{STOP}$ output from the comparator 140 may be therefore pulled to the second logic value from the first logic value to indicate that the result data $D_{RES}$ is equal to the reference data $D_{ANS}[0]$, where a first rising edge of the determination signal $V_{STOP}$ shown in FIG. 2 may be an example of the second time point mentioned above. The TDC 150 may perform time-to-digital conversion on the delay T0 according to the start signal $V_{START}$ and the determination signal $V_{STOP}$, in order to generate entropy data $D_{TDC}[0]$ corresponding to the delay T0, wherein when the TDC 150 completes the time-to-digital conversion, the flag signal $VALID_{OUT}$ may be pulled to the second logic value from the first logic value. Similarly, at a time point of a second rising edge of the start signal $V_{START}$ (which may be another example of the first time point mentioned above), the input data $D_{IN}$ may be $D_{IN}[1]$ and the reference data $D_{ANS}$ may be $D_{ANS}[1]$, which means the combinational logic circuit 130 receives the input data $D_{IN}[1]$ and starts performing the logic operation on the input data $D_{IN}[1]$. After a delay T1, the combinational logic circuit 130 may complete the logic operation performed on the input data $D_{IN}[1]$ to make the result data $D_{RES}$ be equal to the reference data $D_{ANS}[1]$, and the determination signal $V_{STOP}$ output from the comparator 140 may be therefore pulled to the second logic value from the first logic value to indicate that the result data $D_{RES}$ is equal to the reference data $D_{ANS}[1]$, where a second rising edge of the determination signal $V_{STOP}$ shown in FIG. 2 may be another example of the second time point mentioned above. The TDC 150 may perform time-to-digital conversion on the delay T1 according to the start signal $V_{START}$ and the determination signal $V_{STOP}$, in order to generate entropy data $D_{TDC}[1]$ corresponding to the delay T1, wherein when the TDC 150 completes the time-to-digital conversion, the flag signal $VALID_{OUT}$ may be pulled to the second logic value from the first logic value.

It should be noted that a delay of any logic unit (or each logic unit) within the combinational logic circuit 130 may have randomness due to the impact of noise, and a time period (e.g. the delays T0 and T1) for the logic operation performed on any input data by the combinational logic circuit 130 may also have randomness, making the entropy data $D_{TDC}[0]$ and $D_{TDC}[1]$ output from the TDC 150 also have randomness.

Figure 3:
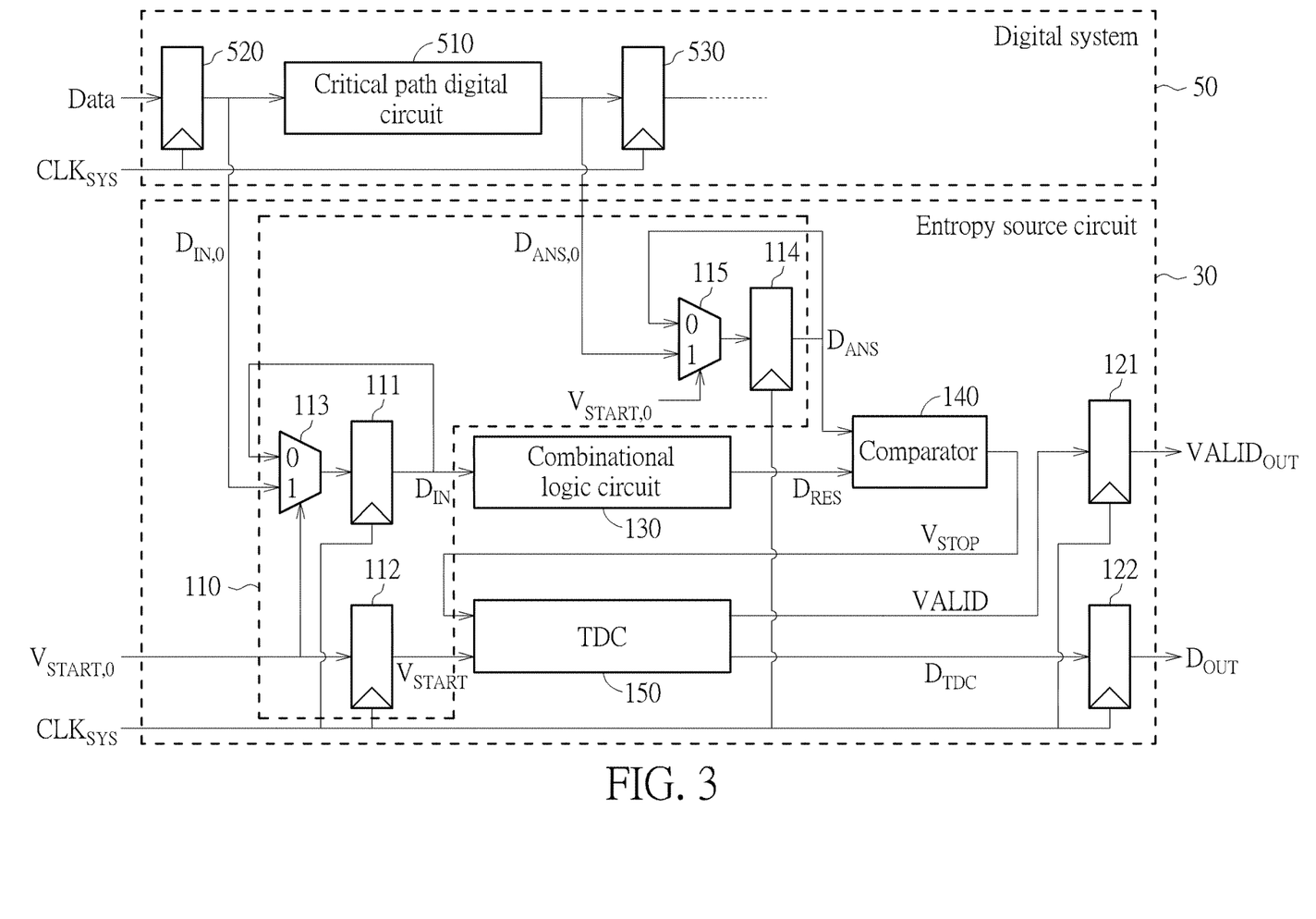
FIG. 3 is a diagram illustrating a detailed implementation of an entropy source circuit coupled to a digital system according to an embodiment of the present invention.

FIG. 3 is a diagram illustrating a detailed implementation of an entropy source circuit 30 coupled to a digital system 50 according to an embodiment of the present invention, where the entropy source circuit may be an example of the entropy source circuit 10 shown in FIG. 1. In this embodiment, operations of the digital system 50 may comprise multiple signal paths, where a critical path of the multiple digital signal paths is a digital signal path having a longest delay among the multiple digital signal paths, and a logic operation corresponding to the critical path is equal to the logic operation performed on the input data $D_{IN}$ by the combinational logic circuit 130. In particular, the critical path is provided by a critical path digital circuit 510 within the digital system 50. For example, a combination of logic gates within the combinational logic circuit 130 may be identical to a combination of logic gates within the critical path digital circuit 510. As shown in FIG. 3, the input data $D_{IN}$ 0 mentioned in the embodiment of FIG. 1 may be data obtained from an input terminal of the critical path digital circuit 510 (e.g. data transmitted to the critical path digital circuit 510 from a flip-flop 520), and the reference data $D_{ANS},0$ mentioned in the embodiment of FIG. 1 may be data obtained from an output terminal of the critical path digital circuit 510 (e.g. result data generated to a flip-flop 530 in advance by the critical path digital circuit 510 according to the input data $D_{IN,0}$).

As shown in FIG. 3, in addition to the combinational logic circuit 130, the comparator 140 and the TDC 150, the entropy source circuit 30 may further comprise a flip-flop 111, a flip-flop 112 and a selector 113, where two input terminals (respectively labeled "0" and "1") of the selector 113 are respectively coupled to an output terminal of the flip-flop 111 and the input terminal of the critical path digital circuit 510, and an output terminal of the selector 113 is coupled to an input terminal of the flip-flop 111. In addition, the entropy source circuit 30 may further comprise a flip-flop 114 and a selector 115, where two input terminals (respectively labeled "0" and "1") of the selector 115 are respectively coupled to an output terminal of the flip-flop 114 and the output terminal of the critical path digital circuit 510, and an output terminal of the selector 115 is coupled to an input terminal of the flip-flop 114. The portion comprising the flip-flop 111, the flip-flop 112, the selector 113, the flip-flop 114 and the selector 115 may be an example of the input data control circuit 110 of the embodiment of FIG. 1, but the present invention is not limited thereto. In addition, the entropy source circuit 30 may further comprise flip-flops 121 and 122, where the portion comprising the flip-flops 121 and 122 may be an example of the output data control circuit 120 of the embodiment of FIG. 1, but the present invention is not limited thereto.

In this embodiment, the selector 113 may be configured to control whether to transmit data of the input terminal of the critical path digital circuit 510 (e.g. the input data $D_{IN,0}$) to the input terminal of the flip-flop 111 according to the start signal $V_{START,0}$. The flip-flop 111 may be configured to control timing of transmitting the input data $D_{IN,0}$ to the combinational logic circuit 130 (e.g. timing of the input data $D_{IN}$) according to the system clock $CLK_{SYS}$. The flip-flop 112 may be configured to control timing of transmitting the start signal $V_{START,0}$ to the TDC 150 (e.g. timing of the start signal $V_{START}$) according to the system clock $CLK_{SYS}$. For example, when a logic value of the start signal $V_{START,0}$ is "0", the selector 113 may select the input data $D_{IN}$ to be transmitted to the input terminal of the flip-flop 111, to make the value of the input data $D_{IN}$ remain unchanged; and when the logic value of the start signal $V_{START,0}$ is "1", the selector 113 may select the input data $D_{IN,0}$ to be transmitted to the input terminal of the flip-flop 111, to make the value of the input data $D_{IN}$ be updated. In addition, the selector 115 may be configured to control whether to transmit data of the output terminal of the critical path digital circuit 510 (e.g. the reference data $D_{ANS,0}$) to the input terminal of the flip-flop 114 according to the start signal $V_{START,0}$. The flip-flop 114 may be configured to control timing of transmitting the reference data $D_{ANS,0}$ to the comparator 140 (e.g. timing of the reference data $D_{ANS}$) according to the system clock $CLK_{SYS}$. For example, when the logic value of the start signal $V_{START,0}$ is "0", the selector 115 may select the reference data $D_{ANS}$ to be transmitted to the input terminal of the flip-flop 114, to make a value of the reference data $D_{ANS}$ remain unchanged; and when the logic value of the start signal $V_{START,0}$ is "1", the selector 115 may select the reference data $D_{ANS,0}$ to be transmitted to the input terminal of the flip-flop 114, to make the value of the reference data $D_{ANS}$ be updated.

Figure 4:
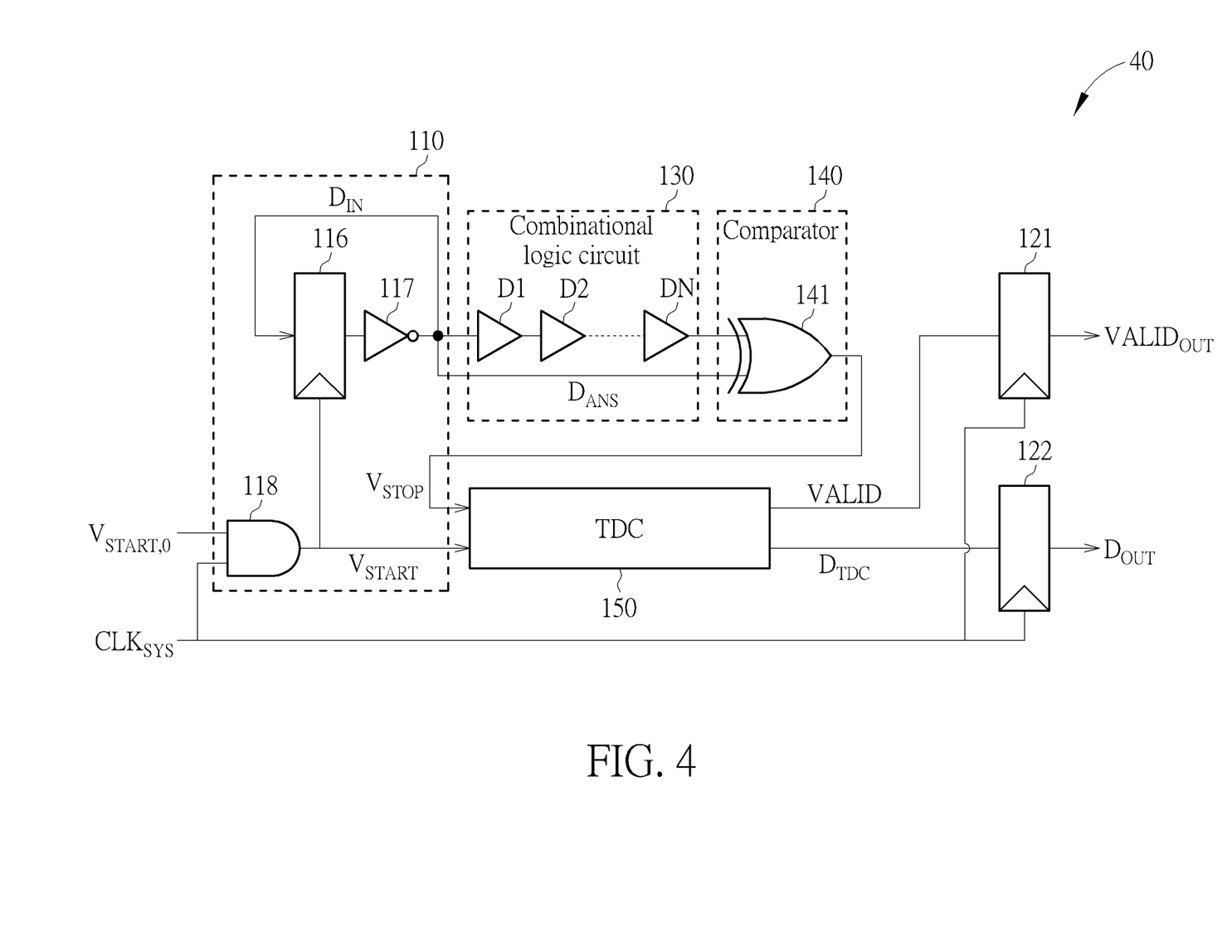
FIG. 4 is a diagram illustrating a detailed implementation of an entropy source circuit according to another embodiment of the present invention.

FIG. 4 is a diagram illustrating a detailed implementation of an entropy source circuit 40 according to another embodiment of the present invention, where the entropy source circuit 40 may be an example of the entropy source circuit 10 shown in FIG. 1. As shown in FIG. 4, in addition to the combinational logic circuit 130, the comparator 140 and the TDC 150, the entropy source circuit 40 may further comprise a flip-flop 116, an inverter 117 and an AND gate 118, where an input terminal of the inverter 117 is coupled to an output terminal of the flip-flop 116, and an output terminal of the inverter 117 is coupled to an input terminal of the flip-flop 116. The portion comprising the AND gate 118, the flip-flop 116 and the inverter 117 may be an example of the input data control circuit 110 mentioned in the embodiment of FIG. 1, but the present invention is not limited thereto. In this embodiment, the flip-flop 116 may be configured to update the values of the input data $D_{IN}$ and the reference data $D_{ANS}$ according to the start signal $V_{START,0}$ and the system clock $CLK_{SYS}$. For example, the AND gate 118 may be configured to perform an AND logic operation on the start signal $V_{START,0}$ and the system clock $CLK_{SYS}$, to generate a timing control signal such as the start signal $V_{START}$, and the flip-flop 116 may update the values of the input data $D_{IN}$ and the reference data $D_{ANS}$ according to the start signal $V_{START}$, where a logic value of the output terminal of the inverter 117 represents the values of the input data $D_{IN}$ and the reference data $D_{ANS}$.

In this embodiment, the combinational logic circuit 130 may comprise multiple delay units D1, D2, . . . , and DN connected in series, where an input terminal of the delay unit D1 may be an input terminal of the combinational logic circuit 130 for receiving the input data $D_{IN}$, and an output terminal of the delay unit DN may be an output terminal of the combinational logic circuit 130 for being coupled to the comparator 140. In this embodiment, the comparator 140 may comprise an exclusive-OR (XOR) gate 141, where a first input terminal of the XOR gate 141 is coupled to the output terminal of the combinational logic circuit 130 (e.g. the output terminal of the delay unit DN), a second input terminal of the XOR gate 141 is coupled to the output terminal of the inverter 117, and a logic value of an output terminal of the XOR gate 141 represents the determination signal $V_{STOP}$.

In particular, the input terminal and the output terminal of the flip-flop 116 may have different logic values, and thus the flip-flop 116 may change the logic value of the output terminal of the inverter 117 in response to a rising edge of the start signal $V_{START}$ (i.e. changing the input data $D_{IN}$ and the reference data $D_{ANS}$ in response to the rising edge of the start signal $V_{START}$). Assume that both the input data $D_{IN}$ and the reference data $D_{ANS}$ are the first logic value at the beginning, and data of the output terminal of the combinational logic circuit 130 is also the first logic value, where the determination signal $V_{STOP}$ output from the comparator 140 may therefore indicate that the data of the output terminal of the combinational logic circuit 130 is identical to the reference data $D_{ANS}$. When the input data $D_{IN}$ and the reference data $D_{ANS}$ are updated to the second logic value in response to the rising edge of the start signal $V_{START}$, the logic value of the determination signal $V_{STOP}$ output from the comparator 140 may be changed to indicate that the data of the output terminal of the combinational logic circuit 130 is different from the reference data $D_{ANS}$. After a period of delay passes, the data of the output terminal of the combinational logic circuit 130 is updated to the second logic value in response to the change of the input data $D_{IN}$, where the logic value of the determination signal $V_{STOP}$ output from the comparator 140 at this moment can be changed again to indicate that the data of the output terminal of the combinational logic circuit 130 is identical to the reference data $D_{ANS}$. Thus, the TDC 150 may perform the aforementioned time-to-digital conversion according to time points of the change in the logic values of the start signal $V_{START}$ and the determination signal $V_{STOP}$, in order to generate the entropy data $D_{TDC}$. Thus, a total delay of the delay units may correspond to the entropy data $D_{TDC}$.

In this embodiment, when the data of the output terminal of the combinational logic circuit 130 is different from the reference data $D_{ANS}$, the logic value of the determination signal $V_{STOP}$ is "1", and when the data of the output terminal of the combinational logic circuit 130 is identical to the reference data $D_{ANS}$, the logic value of the determination signal $V_{STOP}$ is "0", but the present invention is not limited thereto. In some embodiments, the comparator 140 may be implemented with other combinational logic circuits, wherein when the data of the output terminal of the combinational logic circuit 130 is different from the reference data $D_{ANS}$, the logic value of the determination signal $V_{STOP}$ is "0", and when the data of the output terminal of the combinational logic circuit 130 is identical to the reference data $D_{ANS}$, the logic value of the determination signal $V_{STOP}$ is "1".

Figure 5:
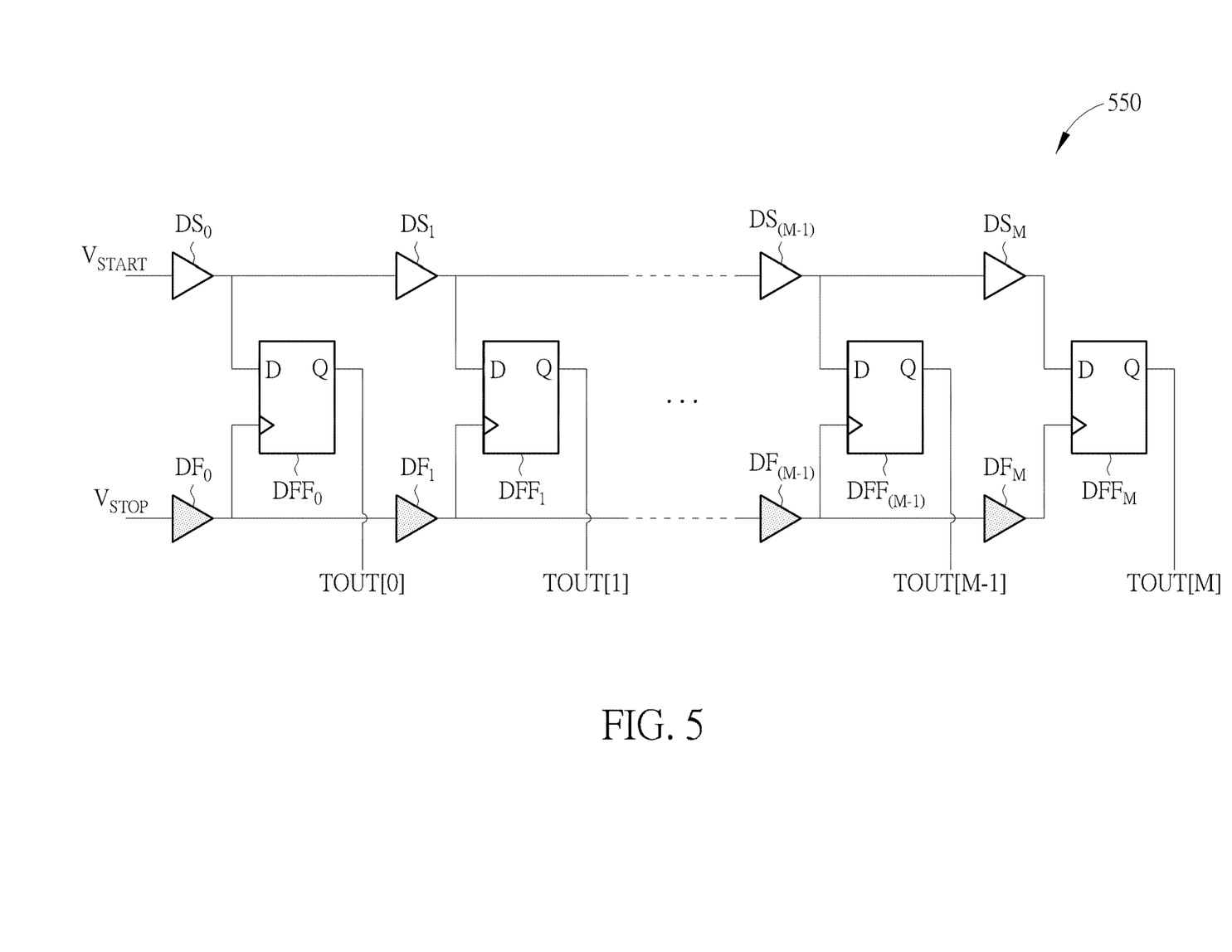
FIG. 5 is a diagram illustrating a detailed implementation of a time-to-digital converter according to an embodiment of the present invention.

FIG. 5 is a diagram illustrating a detailed implementation of a TDC 550 according to an embodiment of the present invention, where the TDC 550 may be an example of the TDC 150 mentioned above. As shown in FIG. 5, the TDC 550 may comprise multiple delay units $DS_0$, $DS_1$, . . . , $DS_{(M-1)}$ and $DS_M$ is a positive integer) connected in series, where an input terminal of a first delay unit such as the delay unit $D_{S0}$ of the delay units $DS_0$, $DS_1$, . . . , $DS_{(M-1)}$ and $DS_M$ is configured to receive the start signal $V_{START}$, wherein the start signal $V_{START}$ may indicate the first time point mentioned above. The TDC 550 may further comprise multiple flip-flops such as D-type flip-flops (DFFs) $DFF_0$, $DFF_1$, . . . , $DFF_{(M-1)}$ and $DFF_M$, where input terminals of the DFFs $DFF_0$, $DFF_1$, $DFF_{(M-1)}$ and $DFF_M$ (labeled "D" in FIG. 5) are respectively coupled to output terminals of the delay units $DS_0$, $DS_1$, . . . , $DS_{(M-1)}$ and $DS_M$, and each DFF of the DFFs $DFF_0$, $DFF_1$, . . . , $DFF_{(M-1)}$ and $DFF_M$ transmits data of the input terminal of each aforementioned DFF to an output terminal (labeled "Q" in FIG. 5) of each aforementioned DFF at the second time point mentioned above according to the determination signal $V_{STOP}$, in order to output (M+1) bits of entropy data {TOUT[0], TOUT[1], . . . , TOUT[M-1], TOUT[M]}. For example, the start signal $V_{START}$ may be changed from the logic value "0" to the logic value "1", and the rising edge of the start signal $V_{START}$ may be transferred, starting from the delay unit $D_{S0}$, to the following delay units, where when the determination signal $V_{STOP}$ is changed from the logic value "0" to the logic value "1", the DFFs $DFF_0$, $DFF_1$, . . . , $DFF_{(M-1)}$ and $DFF_M$ may output the entropy data {TOUT[0], TOUT[1], TOUT [M-1], TOUT[M]} in response to the rising edge of the determination signal $V_{STOP}$. In this embodiment, a value of the entropy data {TOUT[0], TOUT[1], . . . , TOUT[M-1], TOUT[M]} is expressed in a format of a thermometer code. In addition, assume that a delay of each delay unit of the delay units $DS_0$, $DS_1$, . . . , $DS_{(M-1)}$ and $DS_M$ is $T_{SLOW}$, and a delay of each buffer of buffers $DF_0$, $DF_1$, . . . , $DF_{(M-1)}$ and $DF_M$ for transmitting the determination signal $V_{STOP}$ to the DFFs $DFF_0$, $DFF_1$, . . . , $DFF_{(M-1)}$ and $DFF_M$ is $T_{FAST}$, where the delay $T_{SLOW}$ is greater than the delay $T_{FAST}$, and resolution of the TDC 550 may be ($T_{SLOW}-T_{FAST}$), but the present invention is not limited thereto.

Figure 6:
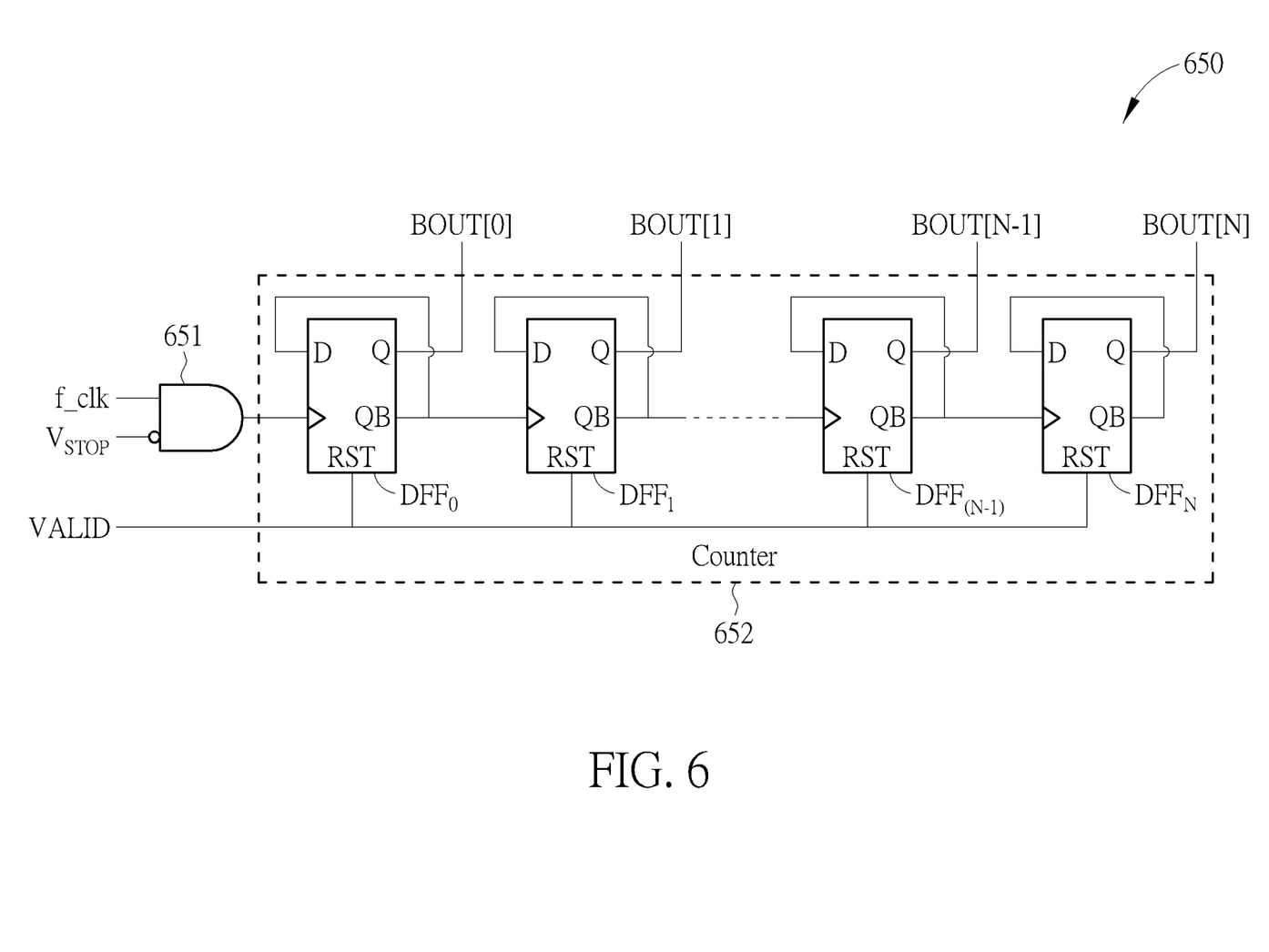
FIG. 6 is a diagram illustrating a detailed implementation of a time-to-digital converter according to another embodiment of the present invention.

FIG. 6 is a diagram illustrating a detailed implementation of a TDC 650 according to another embodiment of the present invention, where the TDC 650 may be an example of the TDC 150 mentioned above. As shown in FIG. 6, the TDC 650 may comprise a clock control logic such as an AND gate 651, where a first input terminal of the AND gate 651 may receive a TDC clock f_clk, and a second input terminal of the AND gate 651 may receive the determination signal $V_{STOP}$ or an inverted signal thereof. In particular, the AND gate 651 may be configured to generate a counting clock according to the TDC clock f_clk and the determination signal $V_{STOP}$, where the counting clock is enabled within a time interval between the first time point and the second time point only. For example, assuming that the determination signal $V_{STOP}$ utilizes the logic value "0" for indicating that the data of the output terminal of the combinational logic circuit 130 is different from the reference data Dares and utilizes the logic value "1" for indicating that the data of the output terminal of the combinational logic circuit 130 is identical to the reference data $D_{ANS}$, the AND gate 651 may perform an AND logic operation on the TDC clock f_clk and the inverted signal of the determination signal $V_{STOP}$ (which is illustrated by a circle on the second input terminal of the AND gate 651 in FIG. 6), to only make the counting clock enabled within the interval between a time point of a falling edge of the determination signal $V_{STOP}$ (or a rising edge of the start signal $V_{START}$) and a time point of a rising edge of the determination signal $V_{STOP}$. The TDC 650 may further comprise a counter 652, where the counter 652 is coupled to an output terminal of the AND gate 651. In this embodiment, the counter 652 is configured to generate a counting result such as entropy data {BOUT[0], BOUT[1], ..., BOUT[N-1], BOUT[N]} according to the counting clock, where the counting result may indicate a number of times of the counting clock toggling within the time interval. For example, the counter 652 may comprise multiple flip-flops such as DFFs $DFF_0$, $DFF_1$, ..., $DFF_{(N-1)}$ and $DFF_N$, where each DFF of the DFFs $DFF_0$, $DFF_1$, ..., $DFF_{(N-1)}$ and $DFF_N$ may comprise a data input terminal (labeled "D" in FIG. 6), a data output terminal (labeled "Q" in FIG. 6), an inverted data output terminal (labeled "QB" in FIG. 6), a clock terminal (illustrated by a triangle in FIG. 6) and a reset terminal (labeled "RST" in FIG. 6). As shown in FIG. 6, the clock terminal of the DFF $DFF_0$ is coupled to the output terminal of the AND gate 651, and the inverted data output terminal of the DFF $DFF_0$ is coupled to the data input terminal of the $DFF_0$. The clock terminal of the DFF $DFF_1$ is coupled to the inverted data output terminal of the DFF $DFF_0$, and the inverted data output terminal of the DFF $DFF_1$ is coupled to the data input terminal of the $DFF_1$. The rest may be deduced by analogy, where the clock terminal of the DFF $DFF_N$ is coupled to the inverted data output terminal of the DFF $DFF_{(N-1)}$, and the inverted data output terminal of the DFF $DFF_N$ is coupled to the data input terminal of the $DFF_N$. In addition, the reset terminals of the DFFs $DFF_0$, $DFF_1$, ..., $DFF_{(N-1)}$ and $DFF_N$ may receive the flag signal VALID, and the data output terminals of the DFFs $DFF_0$, $DFF_1$, ..., $DFF_{(N-1)}$ and $DFF_N$ may output the entropy data {BOUT[0], BOUT[1], ..., BOUT[N-1], BOUT[N]}, where a value of the entropy data {BOUT[0], BOUT[1], ..., BOUT[N-1], BOUT[N]} is expressed in a format of a binary code. In addition, a frequency of the TDC clock f_clk may be greater than a frequency of the system clock $CLK_{SYS}$, where resolution of the TDC 650 may be determined by the frequency of the TDC clock f_clk.

Figure 7:
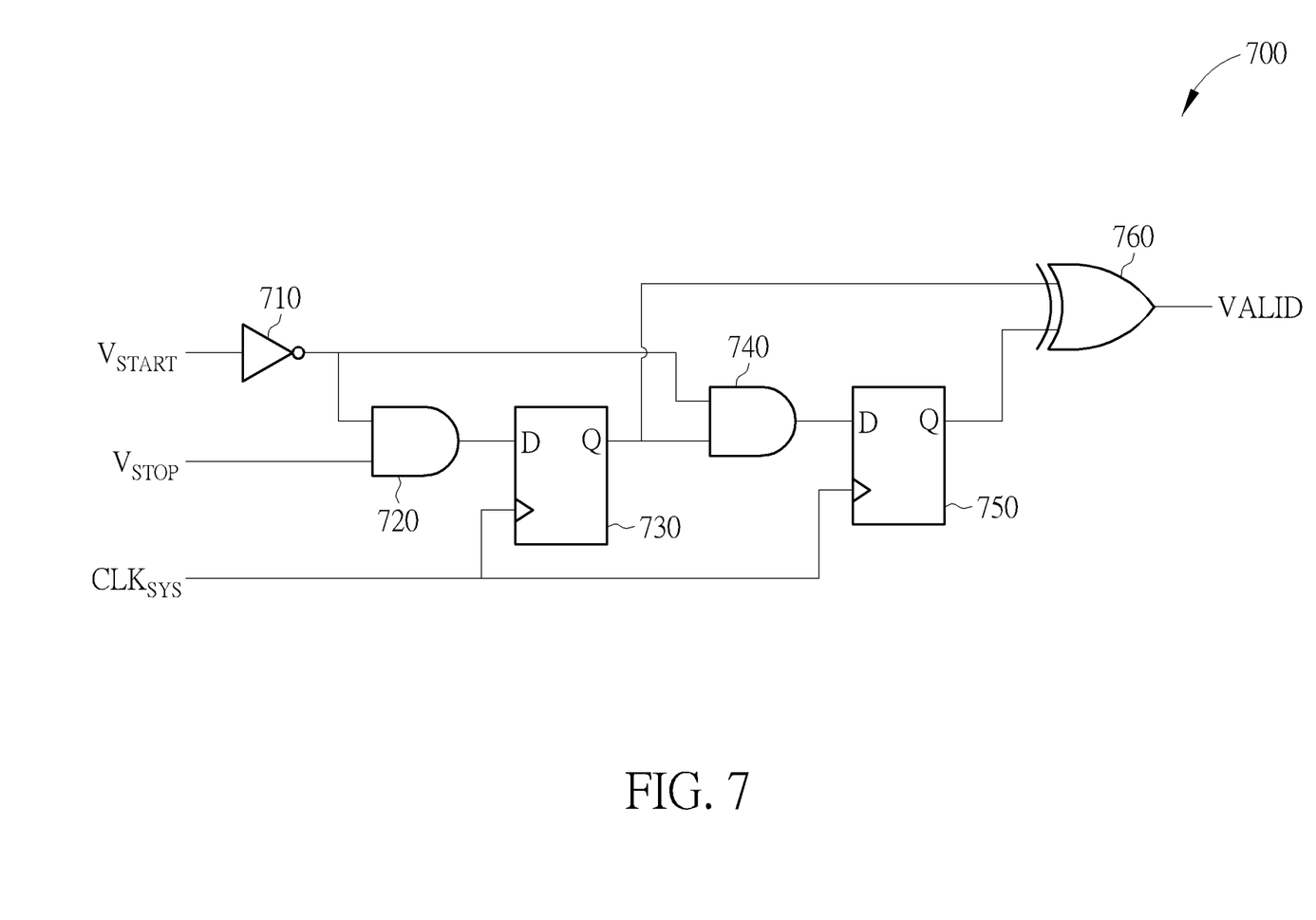
FIG. 7 is a diagram illustrating a flag signal generator according to an embodiment of the present invention.

FIG. 7 is a diagram illustrating a flag signal generator 700 according to an embodiment of the present invention, where any of the entropy source circuit 10 shown in FIG. 1, the entropy source circuit 30 shown in FIG. 3 and the entropy source circuit 40 shown in FIG. 4 may comprise the flag signal generator 700 (e.g. the TDC 150 may comprise the flag signal generator 700). In this embodiment, the flag signal generator 700 may be configured to generate the flag signal VALID according to the system clock $CLK_{SYS}$, the start signal $V_{START}$ and the determination signal $V_{STOP}$, to indicate whether the entropy data $D_{TDC}$ (or the entropy data DOUT) is valid. Under a condition of the flag signal VALID being a first logic value (e.g. the logic value "0"), the start signal $V_{START}$ being the first logic value and the determination signal being the second logic value (e.g. the logic value "1"), the flag signal VALID may be pulled to the second logic value at a time point of a next rising edge of the system clock $CLK_{SYS}$. Under a condition of the flag signal VALID being the second logic value and the determination signal $V_{STOP}$ being the second logic value, the flag signal VALID may be pulled to the first logic value at a time point of the next rising edge of the system clock $CLK_{SYS}$.

As shown in FIG. 7, the flag signal generator 700 may comprise an inverter 710, a first AND gate such as an AND gate 720, a first flip-flop such as a DFF 730, a second AND gate such as an AND gate 740, a second flip-flop such as a DFF 750, and an XOR gate 760. In this embodiment, the inverter 710 may be configured to receive the start signal $V_{START}$. A first input terminal of the AND gate 720 is coupled to an output terminal of the inverter 710, and a second input terminal of the AND gate 720 is configured to receive the determination signal $V_{STOP}$. A data input terminal (labeled "D" in FIG. 7) of the DFF 730 is coupled to an output terminal of the AND gate 720, and a clock terminal (illustrated by a triangle in FIG. 7) of the DFF 730 is configured to receive the system clock $CLK_{SYS}$. A first input terminal of the AND gate 740 is coupled to the output terminal of the inverter 710, and a second input terminal of the AND gate 740 is coupled to a data output terminal (labeled "Q" in FIG. 7) of the DFF 730. A data input terminal (labeled "D" in FIG. 7) of the DFF 750 is coupled to an output terminal of the AND gate 740, and a clock terminal (illustrated by a triangle in FIG. 7) of the DFF 750 is configured to receive the system clock $CLK_{SYS}$. Two input terminals of the XOR gate 760 are respectively coupled to data output terminals (labeled "Q" in FIG. 7) of the DFF 730 and the DFF 750, and the XOR gate 760 may be configured to perform an XOR logic operation on an output of the DFF 730 and an output of the DFF 750, in order to generate the flag signal VALID.

Figure 8:
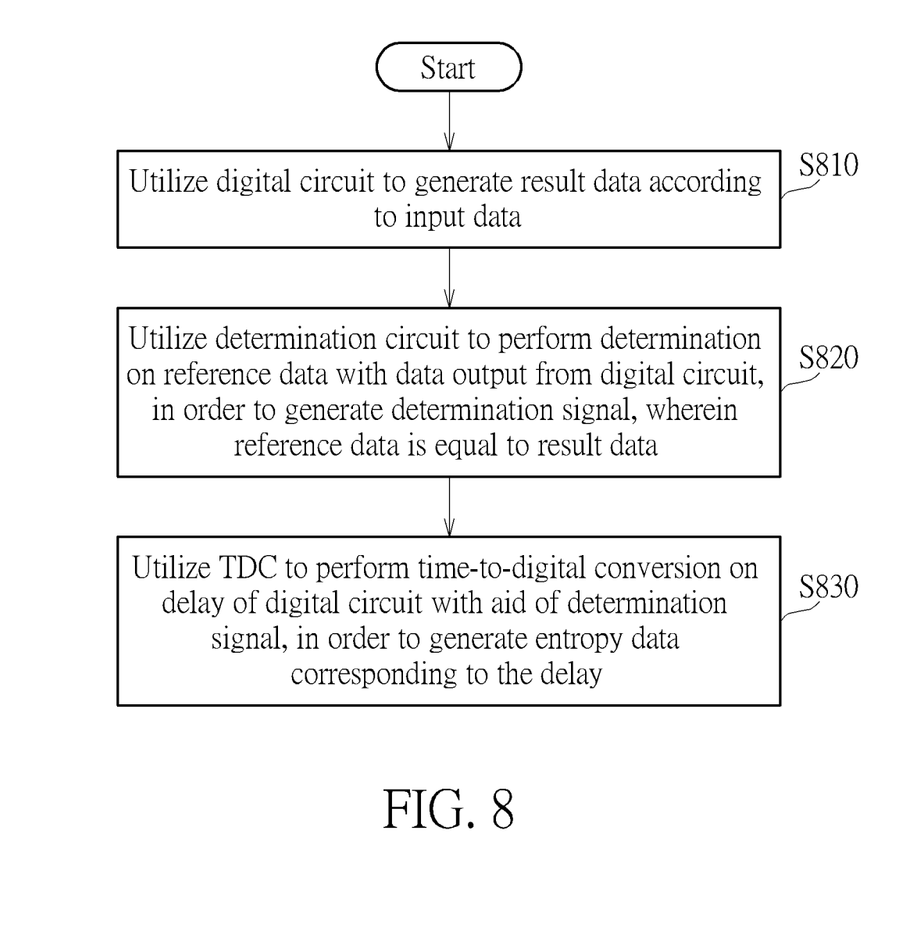
FIG. 8 is a diagram illustrating a working flow of a method for collecting randomness from operation time of a digital circuit according to an embodiment of the present invention.

FIG. 8 is a diagram illustrating a working flow of a method for collecting randomness from operation time of a digital circuit according to an embodiment of the present invention, where the method is applicable to an entropy source circuit such as the entropy source circuit 10 shown in FIG. 1, the entropy source circuit 30 shown in FIG. 3 and the entropy source circuit 40 shown in FIG. 4, and the entropy source circuit may comprise the digital circuit. It should be noted that the working flow shown in FIG. 8 is for illustrative purposes only, and is not meant to be a limitation of the present invention. More particularly, one or more steps may be added, deleted or modified in the working flow shown in FIG. 8. In addition, if an overall result is not hindered, these steps do not have to be executed in the exact order shown in FIG. 8.

In Step S810, the entropy source circuit may utilize the digital circuit (e.g. the combinational logic circuit 130) to generate a result data according to an input data.

In Step S820, the entropy source circuit may utilize a determination circuit (e.g. the comparator 140) to perform determination on reference data with data output from the digital circuit, in order to generate a determination signal, wherein the reference data is equal to the result data.

In Step S830, the entropy source circuit may utilize a TDC (e.g. the TDC 150) to perform time-to-digital conversion on a delay of the digital circuit (e.g. the delay for generating the result data according to the input data spent by the digital circuit) with aid of the determination signal, in order to generate entropy data such as an entropy value corresponding to the delay.

To summarize, the entropy source circuit and the method provided by the embodiments of the present invention can generate entropy data by collecting randomness from operation time of a combinational logic circuit, and the design of the entropy source circuit can be integrated into a digital design flow. Thus, efficiency of an overall design flow can be effectively improved. In addition, the embodiment of the present invention will not greatly increase additional costs. Thus, the present invention can improve the efficiency of the overall design flow without introducing any side effect or in a way that is less likely to introduce side effects.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An entropy source circuit, comprising:
    a digital circuit, configured to generate a result data at a second time point according to an input data received at a first time point;
    a determination circuit, coupled to the digital circuit, configured to perform determination on reference data with a dynamic output generated by the digital circuit, in order to generate a determination signal, wherein the reference data is equal to the result data; and
    a time-to-digital converter (TDC), coupled to the determination circuit, configured to perform time-to-digital conversion on a delay of the digital circuit for generating the result data according to the input data with aid of the determination signal, in order to generate entropy data corresponding to the delay, wherein a time difference between the first time point and the second time point represents the delay.

2. The entropy source circuit of claim 1, further comprising:
    a flip-flop, configured to update the input data and the reference data according to a start signal and a system clock; and
    an inverter, wherein an input terminal of the inverter is coupled to an output terminal of the flip-flop, and an output terminal of the inverter is coupled to an input terminal of the flip-flop and the digital circuit;
    wherein a logic value of the output terminal of the inverter represents the input data and the reference data.

3. The entropy source circuit of claim 2, wherein the determination circuit comprises:
    an exclusive-OR (XOR) gate, wherein a first input terminal of the XOR gate is coupled to an output terminal of the digital circuit, a second input terminal of the XOR gate is coupled to an output terminal of the inverter, and a logic value of an output terminal of the XOR gate represents the determination signal.

4. The entropy source circuit of claim 2, further comprising:
    an AND gate, configured to perform an AND logic operation on the start signal and the system clock, in order to generate a timing control signal, wherein the inverter updates the input data and the reference data according to the timing control signal.

5. The entropy source circuit of claim 1, wherein the entropy source circuit is coupled to a digital system, the digital system comprises multiple digital signal paths, and a critical path of the multiple digital signal paths is a digital signal path having a longest delay among the multiple digital signal paths, wherein a logic operation corresponding to the critical path is equal to a logic operation performed on the input data by the digital circuit.

6. The entropy source circuit of claim 5, wherein the digital circuit receives the input data from an input terminal of the critical path, and receives the reference data from an output terminal of the critical path.

7. The entropy source circuit of claim 6, further comprising:
    a first flip-flop, configured to control timing of transmitting the input data to the digital circuit according to a system clock;
    a second flip-flop, configured to control timing of transmitting a start signal to the TDC according to the system clock; and
    a selector, coupled to the first flip-flop and the input terminal of the critical path, configured to control whether to transmit data of the input terminal of the critical path to an input terminal of the first flip-flop according to the start signal.

8. The entropy source circuit of claim 6, further comprising:
    a flip-flop, configured to control timing of transmitting the reference data to the determination circuit according to a system clock; and
    a selector, coupled to the flip-flop and the output terminal of the critical path, configured to control whether to transmit data of the output terminal of the critical path to an input terminal of the flip-flop according to the start signal.

9. The entropy source circuit of claim 1, wherein the TDC comprises:
    multiple delay units connected in series, wherein an input terminal of a first delay unit of the multiple delay units is configured to receive a start signal, and the start signal indicates the first time point; and
    multiple flip-flops, wherein input terminals of the multiple flip-flops are respectively coupled to output terminals of the multiple delay units, and each flip-flop of the multiple flip-flops transmits data of the input terminal of said each flip-flop to an output terminal of said each flip-flop at the second time point according to the determination signal.

10. The entropy source circuit of claim 1, wherein the TDC comprises:
    a clock control logic, configured to generate a counting clock according to a time-to-digital conversion clock and the determination signal, wherein the counting clock is enabled within a time interval between the first time point and the second time point only; and
    a counter, coupled to the clock control logic, configured to generate a counting result according to the counting clock, wherein the counting result indicates a number of times of the counting clock toggling within the time interval.

11. The entropy source circuit of claim 10, wherein the entropy source circuit further comprises:
    a flag signal generator, configured to generate a flag signal according to a system clock, a start signal and the determination signal, to indicate whether the entropy data is valid or not, wherein the start signal indicates the first time point;
    wherein under a condition of the flag signal being a first logic value, the start signal being the first logic value and the determination signal being a second logic value, the flag signal is pulled to the second logic value at a time point of a next rising edge of the system clock; and under a condition of the flag signal being the second logic value and the determination signal being the second logic value, the flag signal is pulled to the first logic value at a time point of the next rising edge of the system clock.

12. The entropy source circuit of claim 11, wherein the flag signal generator comprises:
    an inverter, configured to receive the start signal;
    a first AND gate, wherein a first input terminal of the first AND gate is coupled to an output terminal of the inverter, and a second input terminal of the first AND gate is configured to receive the determination signal;
    a first flip-flop, wherein a data input terminal of the first flip-flop is coupled to an output terminal of the first AND gate, and a clock terminal of the first flip-flop is configured to receive the system clock;

a second AND gate, wherein a first input terminal of the second AND gate is coupled to the output terminal of the inverter, and a second input terminal of the second AND gate is coupled to a data output terminal of the first flip-flop;

a second flip-flop, wherein a data input terminal of the second flip-flop is coupled to an output terminal of the second AND gate, and a clock terminal of the second flip-flop is configured to receive the system clock; and an exclusive-OR (XOR) gate, coupled to the first flip-flop and the second flip-flop, configured to perform an XOR logic operation on an output of the first flip-flop and an output of the second flip-flop, in order to generate the flag signal.

13. An entropy source circuit, comprising:

an input data control circuit, configured to output a start signal, input data, and reference data corresponding to the input data;

a digital circuit, having an input terminal and an output terminal, wherein the input terminal of the digital circuit is configured to receive the input data;

a determination circuit, coupled to the output terminal of the digital circuit, configured to receive the reference data, wherein when an output generated on the output terminal of the digital circuit is equal to the reference data, the determination circuit generates a determination signal; and a time-to-digital converter (TDC), coupled to the input data control circuit and the determination circuit, configured to receive the start signal and generate entropy data according to the start signal and the determination signal.

14. The entropy source circuit of claim 13, wherein the digital circuit receives the input data at a first time point, and the determination signal indicates that the output generated on the output terminal of the digital circuit is equal to the reference data at a second time point, wherein a time difference between the first time point and the second time point corresponds to the entropy data.

15. The entropy source circuit of claim 13, wherein the input data control circuit comprises:

an AND gate, configured to perform an AND logic operation on an external control signal and a system clock, in order to generate the start signal;

a flip-flop, configured to control timing of updating the input data and the reference data according to the start signal; and an inverter, wherein an input terminal of the inverter is coupled to an output terminal of the flip-flop, and an output terminal of the inverter is coupled to an input terminal of the flip-flop and the digital circuit;

wherein a logic value of the output terminal of the inverter represents the input data and the reference data.

16. The entropy source circuit of claim 15, wherein the digital circuit comprises:

multiple delay units connected in series, wherein an input terminal of a first delay unit of the multiple delay units is coupled to the output terminal of the inverter, and an output terminal of a last delay unit of the multiple delay units is coupled to the determination circuit.

17. The entropy source circuit of claim 16, wherein the determination circuit comprises:

an exclusive-OR (XOR) gate, wherein a first input terminal of the XOR gate is coupled to the output terminal of the last delay unit, and a second input terminal of the XOR gate is coupled to the output terminal of the inverter;

wherein a logic value of an output terminal of the XOR gate represents the determination signal.

18. The entropy source circuit of claim 13, wherein the input data control circuit comprises:

a first flip-flop, configured to control timing of transmitting the input data to the digital circuit according to a system clock;

a second flip-flop, configured to control timing of transmitting the start signal to the TDC according to the system clock; and a first selector, coupled to the first flip-flop, configured to control whether to transmit updated input data to an input terminal of the first flip-flop according to the start signal;

a third flip-flop, configured to control timing of transmitting the reference data to the determination circuit according to the system clock; and a second selector, coupled to the third flip-flop, configured to control whether to transmit updated reference data to an input terminal of the third flip-flop according to the start signal.

19. The entropy source circuit of claim 18, wherein the entropy source circuit is coupled to a digital system, the digital system comprises a critical path, and an input terminal and an output terminal of the critical path are coupled to the first selector and the second selector, respectively, wherein a logic operation corresponding to the critical path is equal to a logic operation performed on the input data by the digital circuit.

20. The entropy source circuit of claim 19, wherein the digital system comprises multiple digital signal paths, and the critical path is a digital signal path having a longest delay among the multiple digital signal paths.

* * * * *